US009601459B2

United States Patent
Dubey et al.

(10) Patent No.: US 9,601,459 B2
(45) Date of Patent: Mar. 21, 2017

(54) METHOD FOR ALIGNING MICRO-ELECTRONIC COMPONENTS

(71) Applicants: IMEC VZW, Leuven (BE); Katholieke Universiteit Leuven, KU LEUVEN R&D, Leuven (BE)

(72) Inventors: Vikas Dubey, Leuven (BE); Ingrid De Wolf, Leuven (BE); Eric Beyne, Leuven (BE)

(73) Assignees: IMEC VZW, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 0 days.

(21) Appl. No.: 14/576,637

(22) Filed: Dec. 19, 2014

(65) Prior Publication Data

US 2015/0179605 A1     Jun. 25, 2015

(30) Foreign Application Priority Data

Dec. 19, 2013   (EP) ..................................... 13198464

(51) Int. Cl.
   *H01L 29/80* (2006.01)
   *H01L 23/00* (2006.01)
   (Continued)

(52) U.S. Cl.
   CPC .............. *H01L 24/83* (2013.01); *H01L 24/33* (2013.01); *H01L 24/80* (2013.01); *H01L 24/81* (2013.01);
   (Continued)

(58) Field of Classification Search
   CPC ......... H01L 21/67; H01L 21/78; H01L 21/98; H01L 21/70
   (Continued)

(56) References Cited

U.S. PATENT DOCUMENTS 5,866,281 A * 2/1999 Guckel ..................... G03F 1/22
                                              430/22
5,919,606 A * 7/1999 Kazlas ................ G02F 1/13394
                                              349/153
(Continued)

OTHER PUBLICATIONS

Fukushima, T. et al., "New Chip-to-Wafer 3D Integration Technology Using Hybrid Self-Assembly and Electrostatic Temporary Bonding", 978-1-4673-4871-3/12 2012 IEEE, pp. 33.3.1-33.3.4.

*Primary Examiner* — Michael Lebentritt
(74) *Attorney, Agent, or Firm* — McDonnell Boehnen Hulbert & Berghoff LLP

(57) ABSTRACT

Alignment of a first micro-electronic component to a receiving surface of a second micro-electronic component is realized by a capillary force-induced self-alignment, combined with an electrostatic alignment. The latter is accomplished by providing at least one first electrical conductor line along the periphery of the first component, and at least one second electrical conductor along the periphery of the location on the receiving surface of the second component onto which the component is to be placed. The contact areas surrounded by the conductor lines are covered with a wetting layer. The electrical conductor lines may be embedded in a strip of anti-wetting material that runs along the peripheries to create a wettability contrast. The wettability contrast helps to maintain a drop of alignment liquid between the contact areas so as to obtain self-alignment by capillary force. By applying appropriate charges on the conductor lines, electrostatic self-alignment is realized, which improves the alignment obtained through capillary force and maintains the alignment during evaporation of the liquid.

15 Claims, 9 Drawing Sheets

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 24/05* (2013.01); *H01L 24/08* (2013.01); *H01L 24/13* (2013.01); *H01L 24/16* (2013.01); *H01L 2224/0213* (2013.01); *H01L 2224/0214* (2013.01); *H01L 2224/0217* (2013.01); *H01L 2224/0218* (2013.01); *H01L 2224/0224* (2013.01); *H01L 2224/0225* (2013.01); *H01L 2224/02145* (2013.01); *H01L 2224/02175* (2013.01); *H01L 2224/02185* (2013.01); *H01L 2224/02255* (2013.01); *H01L 2224/0401* (2013.01); *H01L 2224/05647* (2013.01); *H01L 2224/08145* (2013.01); *H01L 2224/08225* (2013.01); *H01L 2224/10135* (2013.01); *H01L 2224/10145* (2013.01); *H01L 2224/10165* (2013.01); *H01L 2224/10175* (2013.01); *H01L 2224/13147* (2013.01); *H01L 2224/16145* (2013.01); *H01L 2224/16147* (2013.01); *H01L 2224/16225* (2013.01); *H01L 2224/16227* (2013.01); *H01L 2224/16237* (2013.01); *H01L 2224/80007* (2013.01); *H01L 2224/8013* (2013.01); *H01L 2224/80121* (2013.01); *H01L 2224/80132* (2013.01); *H01L 2224/80143* (2013.01); *H01L 2224/80203* (2013.01); *H01L 2224/80894* (2013.01); *H01L 2224/80907* (2013.01); *H01L 2224/81007* (2013.01); *H01L 2224/8113* (2013.01); *H01L 2224/81121* (2013.01); *H01L 2224/81132* (2013.01); *H01L 2224/81141* (2013.01); *H01L 2224/81143* (2013.01); *H01L 2224/81191* (2013.01); *H01L 2224/81193* (2013.01); *H01L 2224/81815* (2013.01); *H01L 2224/81894* (2013.01); *H01L 2224/81907* (2013.01); *H01L 2224/83143* (2013.01); *H01L 2225/06513* (2013.01); *H01L 2225/06517* (2013.01); *H01L 2225/06541* (2013.01); *H01L 2225/06593* (2013.01)

(58) Field of Classification Search
USPC ...................................... 438/12–15, 106–113
See application file for complete search history.

(56) References Cited

U.S. PATENT DOCUMENTS

| | | | |
|---|---|---|---|
| 6,049,974 | A | 4/2000 | Asanasavest |
| 6,433,411 | B1* | 8/2002 | Degani ................. B81B 7/0041 257/678 |
| 6,518,679 | B2 | 2/2003 | Lu et al. |
| 6,536,106 | B1* | 3/2003 | Jackson ................. B82Y 10/00 204/155 |
| 6,710,436 | B1 | 3/2004 | Harris et al. |
| 6,879,143 | B2* | 4/2005 | Nagahara ................ B03C 5/026 324/71.1 |
| 6,927,982 | B2* | 8/2005 | Mergenthaler .......... H01L 24/10 257/E21.511 |
| 6,995,039 | B2* | 2/2006 | Harris ...................... H01L 23/50 257/E21.511 |
| 8,102,064 | B2 | 1/2012 | Renn |
| 8,926,065 | B2* | 1/2015 | Winger ................... B41J 2/1606 347/45 |
| 9,137,935 | B2* | 9/2015 | Morris ..................... H01L 24/95 |
| 9,223,317 | B2* | 12/2015 | Winger ................. G05D 7/0629 |
| 2004/0021254 | A1* | 2/2004 | Sreenivasan ........ B29C 35/0888 264/406 |
| 2004/0156478 | A1* | 8/2004 | Appleby ................ B23P 15/246 378/147 |
| 2005/0074913 | A1* | 4/2005 | Gory ................. H01L 21/67023 438/48 |
| 2006/0077150 | A1* | 4/2006 | Sampsell ............. B81C 1/00944 345/85 |
| 2006/0234405 | A1 | 10/2006 | Best |
| 2008/0083818 | A1* | 4/2008 | Best ........................ B23K 31/02 228/103 |
| 2010/0203676 | A1* | 8/2010 | Theuss .................. H01L 21/561 438/109 |
| 2012/0313236 | A1 | 12/2012 | Wakiyama et al. |
| 2013/0199831 | A1* | 8/2013 | Morris ..................... H01L 24/95 174/260 |
| 2015/0228622 | A1* | 8/2015 | Koyanagi ......... H01L 23/49838 257/777 |

* cited by examiner

METHOD FOR ALIGNING MICRO-ELECTRONIC COMPONENTS

CROSS-REFERENCE TO RELATED APPLICATION

This application claims priority to European Patent Application No. 13198464.3 filed on Dec. 19, 2013, the contents of which are hereby incorporated by reference.

FIELD OF THE DISCLOSURE

The present disclosure is related to methods for assembling micro-electronic components, in particular semiconductor components such as integrated circuit chips. The disclosure is specifically related to the alignment of components in a micro-electronic component assembly.

STATE OF THE ART

Inaccurate alignment during chip stacking leads to misaligned interconnects between top and bottom chips and therefore less reliable bonding quality which thereby decreases data flow within the stacked chips. IC chips are stacked onto a base substrate or onto other IC's in a stack by robotic pick-and-place method, either on a chip per chip basis or by attaching multiple chips to a carrier and placing the chips onto a base substrate. In either of these techniques, it is known that self-alignment of individual chips with respect to their intended location on the base substrate or on a previously deposited chip can be applied. This is obtained by making the surfaces that are to face each other hydrophilic and introducing a drop of water between the surfaces as the chip is placed. Self-alignment is established through capillary force which results from surface tension of the fluid in the water-filled space between the two components. Once the two surfaces are aligned, the electrical bond between the microbumps of the components can be accomplished by thermocompression, direct bonding or reflow techniques, the fluid between the components being evaporated by heating the assembly or by letting the assembly dry at room temperature.

These techniques suffer from a number of inaccuracies in terms of a correct alignment. Alignment is not consistent for multiple chips placed throughout the same wafer. During bonding, alignment is likely to become lost especially when thermocompression is used. Finally, as the size and thus the weight of individual ICs decreases, for instance by backgrinding, the surface tension based alignment fails to align the ICs correctly as the weight is not enough to develop a capillary force for self-alignment. Also, when the thickness of the ICs decreases, warping of the ICs is likely to occur due to internal strain of different layers. These abovementioned factors contribute to the overall misalignment.

SUMMARY OF THE DISCLOSURE

The disclosure is related to a method for aligning a first micro-electronic component to a receiving surface of a second component. In one example, a first micro-electronic component and a second micro-electronic component both comprise a contact area and the contact areas are covered by a wetting layer. Both components comprises a means for containing an alignment liquid on the wetting layers, and each of the components is further provided with one or more conductor lines running along the circumference of the respective contact areas. In other words, the conductor lines run in close proximity to the circumference, either inside or outside the circumference. The method for aligning these components includes applying an amount of the alignment liquid to the contact area of the second component, and placing the first component with its contact area facing the second component's contact area so that the liquid contacts both wetting layers, and thereby establishing self-alignment of the contact areas through capillary force. Further the method includes applying an electric potential such as to charge the conductor lines of at least one of the components, in a manner to realize an electrostatic alignment of the contact areas. In other words, to realize a force between the conductor lines of the first and second component, thereby aligning the conductor lines of both components which in return aligns the components and keeps the components aligned for further bonding processes. The method also includes maintaining the electrostatic alignment while the liquid evaporates.

According to an embodiment of the method of the disclosure, on at least one of the components, the means for containing a liquid on the wetting layers comprises at least one strip of anti-wetting material running along the circumference of the contact area. In another embodiment, the conductor lines may be embedded in or located on top of the at least one strip of anti-wetting material.

According to an embodiment of the method of the disclosure, on at least one of the components, the means for maintaining a liquid on the wetting layers comprise a vertical sidewall surrounding the contact areas.

According to an embodiment of the method of the disclosure, on at least one of the components, the means for maintaining a liquid on the wetting layers comprise the conductor lines themselves, and wherein the conductor lines may have been provided with anti-wetting properties.

According to a further embodiment of the method of the disclosure, one of the components comprises a pair of conductor lines while the other component comprises a single conductor line. In this embodiment, opposite electric potentials are applied to charge the pair of conductor lines, while no potential is applied to the single conductor line. The pair of conductor lines may comprise interdigitated lateral extensions. In the method of the disclosure, the first and second component may each comprise at least one conductor line, wherein first and second potentials are applied to charge the conductor line(s) of the first and second components. In one example, the first and second potential are mutually opposite.

According to an embodiment of the method of the disclosure, the conductor lines on at least one of the components are present on top of the component. According to another embodiment of the method of the disclosure the conductor lines on at least one of the components are incorporated in a passivation layer that is a part of the component.

According to an embodiment of the method of the disclosure, the conductor lines of one of the components are located in a recess running around the circumference of the contact area of the component, and the conductor lines of the other component extend outwardly from the surface of the component. In this embodiment, the alignment is further enhanced through a conformal lock and key mechanism.

The disclosure is equally related to a method for bonding a first micro-electronic component to a second micro-electronic component, wherein the first and second components are aligned according to the method of any one of the embodiments disclosed herein, followed by the step of establishing a permanent bond between the components.

The disclosure is also related to an assembly of two or more micro-electronic components, comprising at least one first micro-electronic component aligned to a second micro-electronic component. In this example, both the first and second components comprise a contact area, the contact areas are covered by a wetting layer, and each of the components are provided with means for containing an alignment liquid on the wetting layers. Each of the components is further provided with one or more conductor lines running along the circumference of the respective contact areas, and the conductor lines of the first and second component face each other. At least one of the components is provided with means for applying an electrical charge to its respective conductor line(s).

According to an embodiment of the assembly of the disclosure, on at least one of the components, the means for containing a liquid on the wetting layers consists of or includes at least one strip of anti-wetting material running along the circumference of the contact area. In another embodiment, the conductor lines may be embedded in or located on top of a strip of anti-wetting material.

According to an embodiment of the assembly of the disclosure, on at least one of the components, the means for maintaining a liquid on the wetting layers consist of or includes a vertical sidewall surrounding the contact areas.

According to an embodiment of the assembly of the disclosure, on at least one of the components, the means for maintaining a liquid on the wetting layers comprise the conductor lines themselves, and wherein the conductor lines have been provided with anti-wetting properties.

In an assembly according to the disclosure, one of the components may comprise a pair of conductor lines, connectable to a means for applying opposite charging potentials to the conductor lines, while the other component comprises a single conductor line not connectable to any means for applying a charging potential to the single conductor line. The single conductor line on the other component can be charged by charge induction from the first micro-component which comprises one or more pairs of oppositely charged conductor lines.

According to an embodiment of the assembly of the disclosure, the first and second components comprise at least one conductor line, and the conductor lines on at least one of the components is connectable to a means for applying a charging potential to the conductor line(s) of the component.

According to an embodiment of the assembly of the disclosure, the conductor lines on at least one of the components are present on top of the component. According to another embodiment of the assembly of the disclosure, the conductor lines on at least one of the components are incorporated in a passivation layer that is a part of the component.

According to an embodiment of the assembly of the disclosure, the conductor lines of one of the components are located in a recess running around the circumference of the contact area of the component, and the conductor lines of the other component extend outwardly from the surface of the respective component.

In the present description, the term 'passivation layer' is to be understood as either a dielectric layer, or a stack of layers comprising at least one dielectric layer, or a dielectric layer with metal lines embedded in the dielectric layer, such as a metallization level produced in the Back End Of Line production step of IC processing.

DETAILED DESCRIPTION OF THE DISCLOSURE

Figure 1:
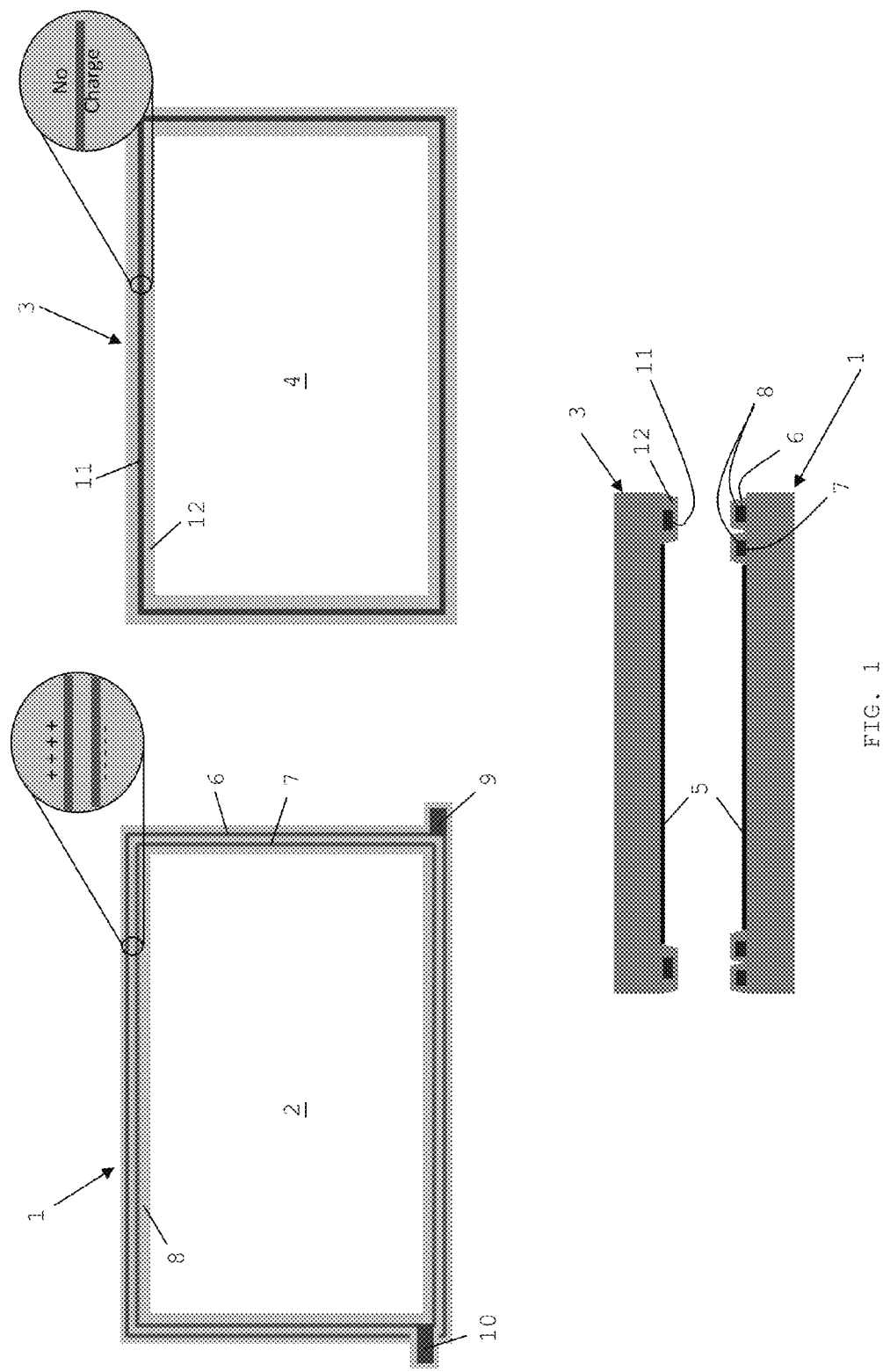
FIG. 1 illustrates a first embodiment of the method of the disclosure, wherein a substrate is provided with two parallel conductor lines and a chip is provided with a single conductor line, in order to establish electrostatic alignment.

According to the disclosure, alignment of a first micro-electronic component to a receiving surface of a second micro-electronic component is realised by a capillary force-induced self-alignment as described above, combined with an electrostatic alignment, driven by an electrostatic force. The latter is accomplished by providing at least one first electrical conductor line along the periphery of a contact area of the first component, and at least one second electrical conductor line along the periphery of a contact area at the location on the receiving surface of the second component onto which the component is to be placed. The contact areas, i.e. the areas that need to be in alignment in the assembly of the two components, are complementary, meaning that they have the same shape and essentially the same size. Likewise, the conductors on the first and second component, given that these conductors are running along the circumference of the contact areas, are complementary, meaning that they have corresponding shapes in the plane of the contact areas, and that the conductor lines of the first component are facing the conductor lines of the second component when the two components are aligned.

The contact areas are furthermore covered with a wetting layer or may be treated for creating the wetting properties in that area. A wetting layer or wetting material is defined in the context of this description as a layer or material that enhances wettability of a given alignment liquid to the wetting layer. An alignment liquid is defined in the context of this description as a liquid applied to establish self-alignment by capillary force, as described in the introductory portion. The most prominent example of wetting layer is a hydrophilic layer, i.e. a layer that enhances the contact to the alignment liquid water by exhibiting a very low contact angle between a drop of water applied to the layer and the layer surface. The components to be aligned are furthermore provided with a means for containing a self-alignment liquid on the wetting layers, i.e. on the contact areas. Being 'covered with a wetting layer' means that the material on the upper surface of the contact areas has wetting properties.

According to one embodiment, the electrical conductor lines are embedded in a strip of anti-wetting material that runs along the peripheries. Anti-wetting material is defined in the context of this description as the opposite of wetting material defined above, i.e. material that impedes contact between the material and a given alignment liquid. The main example here is a hydrophobic material which exhibits a high contact angle or low wettability between a layer of the material and a drop of water applied to it. The wetting and anti-wetting materials are instrumental in maintaining a drop of alignment liquid between the contact areas so as to obtain self-alignment by capillary force. By applying appropriate charges on the conductor lines, electrostatic self-alignment is realized, which improves the alignment obtained through capillary force, and maintains the alignment during evaporation of the alignment liquid. As this liquid evaporates, the gap between the components decreases, which leads to an increase in the electrostatic alignment force. In this way, high quality alignment is ensured throughout the assembly process.

A number of different embodiments are described with reference to the enclosed drawings. In each case, the alignment is described of a chip 3 to a substrate 1, which represent examples of the 'first and second component' referred to in the appended claims. It is to be noted however that the method is applicable to the alignment of any type of component to any type of substrate, including for example the alignment of a chip to another chip in a stacked assembly of IC chips. For the sake of readability of the description, the terms 'hydrophobic', 'hydrophilic' are used and the alignment liquid applied is water, but throughout this description, any of these terms may be replaced by the more general 'wetting' 'anti-wetting' and 'alignment liquid'.

FIG. 1 shows a first embodiment. The substrate 1 has a contact area 2 onto which the chip 3 is to be placed. In the assembly of the chip and the substrate, the chip's contact area 4 is to be aligned to the substrate's contact area 2. Both contact areas 2/4 are provided with solder balls or microbumps (not shown) which are to be bonded together in a bonding process. The contact areas 2/4 are covered with hydrophilic layers 5. These contact areas may be passivation layers covered with a hydrophilic coating or subjected to a treatment rendering the contact areas 2/4 surfaces hydrophilic. The substrate's contact area 2 is surrounded by a pair of conductor lines 6 and 7 that run along the circumference of the contact area 2. The conductor lines 6/7 are mutually parallel. The conductor lines 6/7 are embedded in strips 8 of a hydrophobic material. The conductor lines are connected to contact leads 9 and 10 respectively, through which the conductor lines can be electrically charged. The chip 2 is provided with a single conductor line 11 that runs in a closed loop along the circumference of the chip's contact area 4. The single conductor line 11 is equally embedded in a strip of hydrophobic material 12. When the chip is placed on top of the substrate, the single conductor line 11 faces the area between the double conductor lines 6/7. During the alignment procedure, the conductor lines 6 and 7 on the substrate are charged with opposite electrical charges, as illustrated in the enlarged detail in FIG. 1. The single conductor line 11 receives no charge from an external source connected to the conductor line 11. Charges are therefore induced in the single conductor line 11 via the proximity of the double conductor line 6/7, in a manner to enhance the alignment of the single conductor line 11 with the double conductor line 6/7 and hence of the chip's contact area 4 to the substrate's contact area 2. Advantageously, this embodiment does not require contact leads for charging the conductor line 11 in the chip.

The alignment process for this embodiment may comprise the following steps:

Applying water to the substrate's contact area 2. The water spreads out over the full area 2 as a consequence of the hydrophilic character of the layer 5. The amount of water depends on the size of the contact areas 2/4. The water is contained in this area through the surrounding strips 8 of hydrophobic material.

Placing the chip 3 with its contact area 4 covered with a hydrophilic layer 5 facing the substrate's contact area 2 covered with another hydrophilic layer 5, so that the water contacts both hydrophilic contact areas 2/4, thereby allowing establishing self-alignment through capillary force. This step may be done by pre-aligning the chip (placing it in approximate alignment to the substrate's contact area), holding the chip in a pre-aligned position until the water fully contacts both contact areas 2 and 4, then releasing the chip, so that it can move freely on the water so that self-alignment takes place.

Applying an electric potential such as to charge the conductor lines 6 and 7 with opposite charges, thereby establishing alignment through electrostatic alignment as described above. The conductor lines may be charged before or after the chip 3 is placed above the substrate 1. The result of this step is an assembly of the substrate and chip, aligned with respect to each other, but not yet bonded together definitively, Heating the assembly to thereby remove the water through evaporation, or letting the assembly dry until the water has evaporated. As the water evaporates, the gap between the two components decreases which in return increases the electrostatic pull between the components thereby assisting in final bonding.

These steps may be followed by the realization of a definitive bond between the chip and the substrate, for example by reflow bonding or direct bonding. The charges may be removed either before or after the latter step of realizing a definitive bond.

Figure 2:
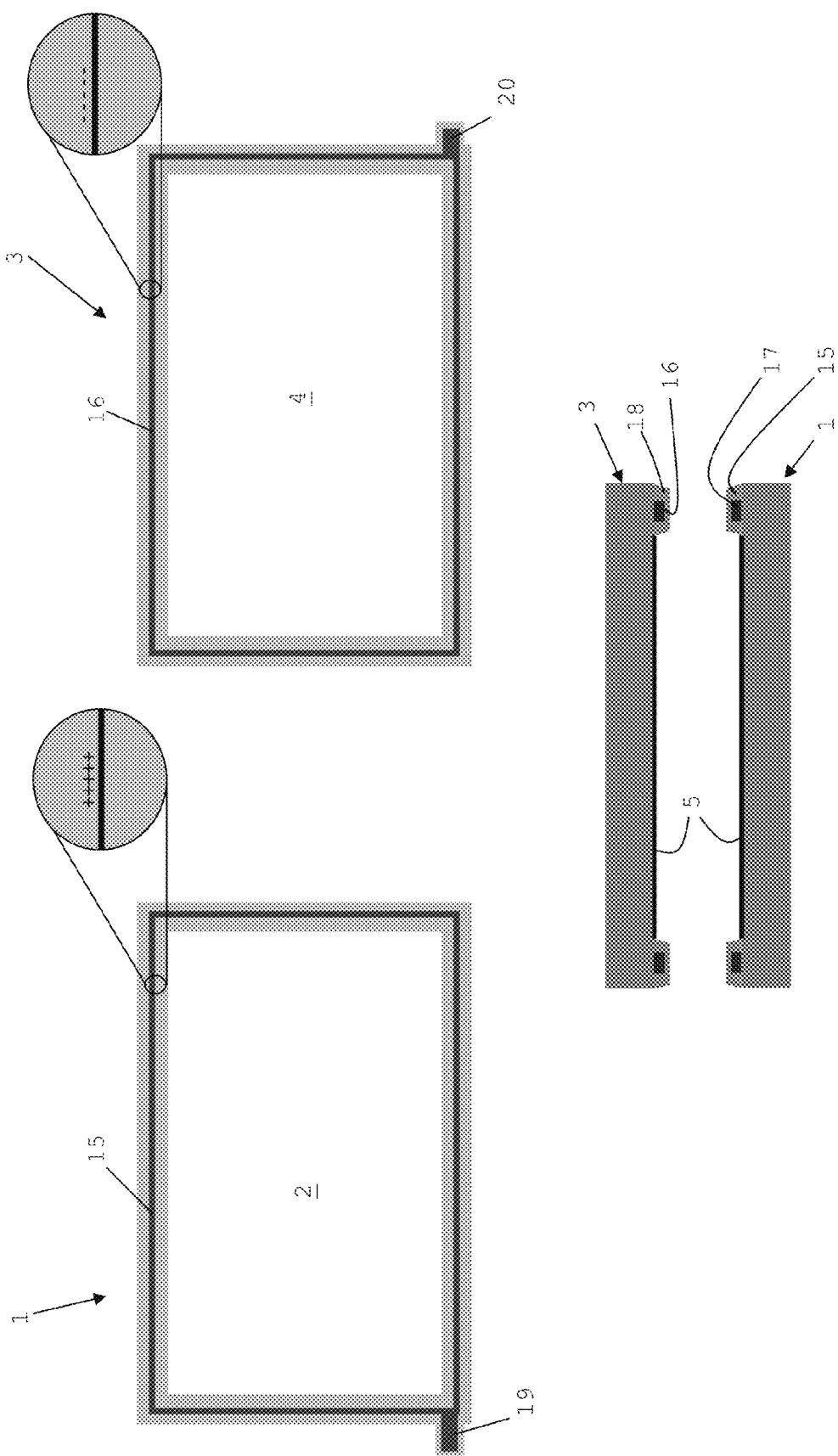
FIG. 2 illustrates a second embodiment, wherein the substrate and chip are each provided with a single conductor line.

A second embodiment is illustrated in FIG. 2. In this case, both the substrate 1 and the chip 3 are provided with single conductor lines 15 and 16 surrounding their respective contact area 2/4, each line being embedded in a strip 17/18 of hydrophobic material, with the contact areas themselves being covered by hydrophilic layers 5. The conductor lines 15/16 are provided with contact leads 19/20 respectively, through which the lines can be charged by applying an electric potential via an external source. The alignment process may comprise the same steps as described above, wherein the electrostatic alignment is realized by charging the lines 15/16 with opposite charges (see details in FIG. 2), so that the lines are attracted to each other in a manner to establish the alignment. Possibly, only one of the conductor lines 15 or 16 is actively connectable to a charging potential, while the other conductor is not (i.e. one of the contact leads 19/20 is not present). In that case, the other conductor line will be charged oppositely to the first conductor line, through the proximity of the first conductor, and an electrostatic alignment will take place. In the embodiment of FIG. 2, more than one conductor line could be present in the substrate and/or the chip. If multiple conductor lines are present in one component, all of the conductors are then charged with the same charge type (+ or −) in the alignment process.

Figure 3:
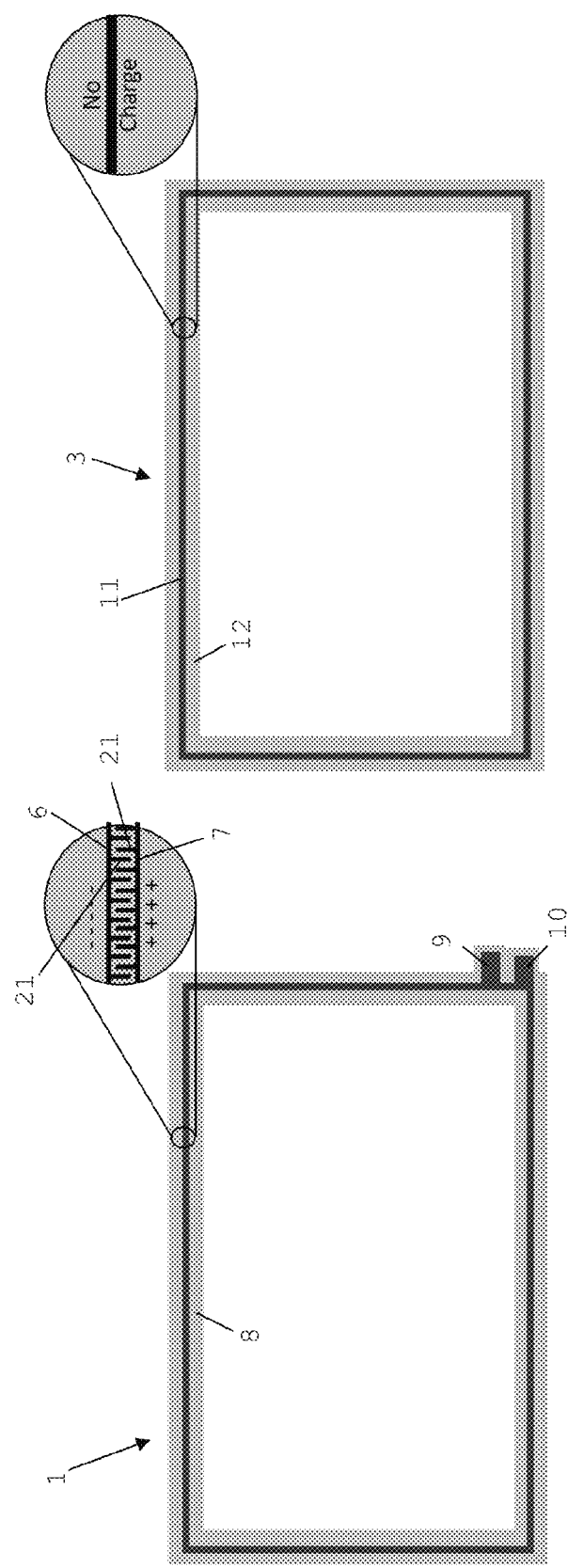
FIG. 3 illustrates a third embodiment, wherein the double conductor lines on the substrate are provided with interdigitated extensions.

A third embodiment illustrated in FIG. 3 is a variation on the first one, but wherein the parallel conductor lines 6 and 7 are provided with interdigitated lateral extensions 21. The conductor lines 6 and 7 are again charged with opposite charges, as in the embodiment of FIG. 1. This creates a higher alignment force, thereby improving the degree of electrostatic alignment between the substrate 1 and the chip 3.

Figure 4A:
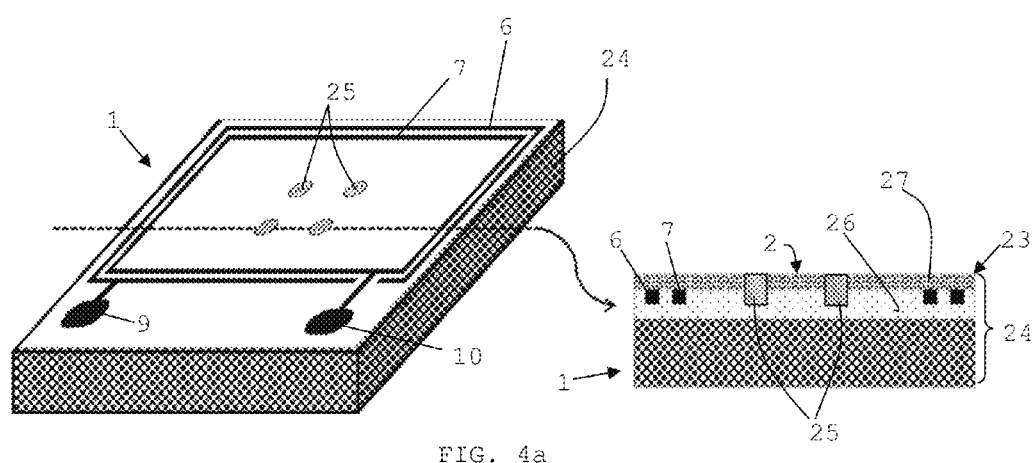
FIGS. 4a and 4b illustrate another embodiment, wherein the conductor lines are incorporated in the components that are to be aligned, and wherein the means for maintaining an alignment liquid on the surface is formed by a vertical sidewall.

FIG. 4 shows another embodiment. The substrate 1 comprises a pair of conductor lines 6/7 as in the previous embodiment. The conductor lines can be charged through contact pads 9/10. Copper microbumps 25 are shown in the contact area 2. The substrate is surrounded by a vertical sidewall 24, defining an edge 23 between the contact surface 2 and the sidewall 24. As seen in the cross-section in FIG. 4a, the contact area 2 corresponds to the whole of the upper substrate surface. The conductor line pair 6/7 is embedded in a first passivation layer 26, and covered by a second passivation layer 27, that is at the same level as the upper surface of the microbumps. The second passivation layer 27 is also a wetting layer, or it may be covered by a wetting layer or it may have been subjected to a wetting treatment. The means for containing a drop of water on the contact area 2 are formed by the vertical side walls 24, which contain the water by the so-called 'edge pinning' effect. Optionally, the sidewalls 24 are furthermore covered by a hydrophobic material.

Figure 4B:
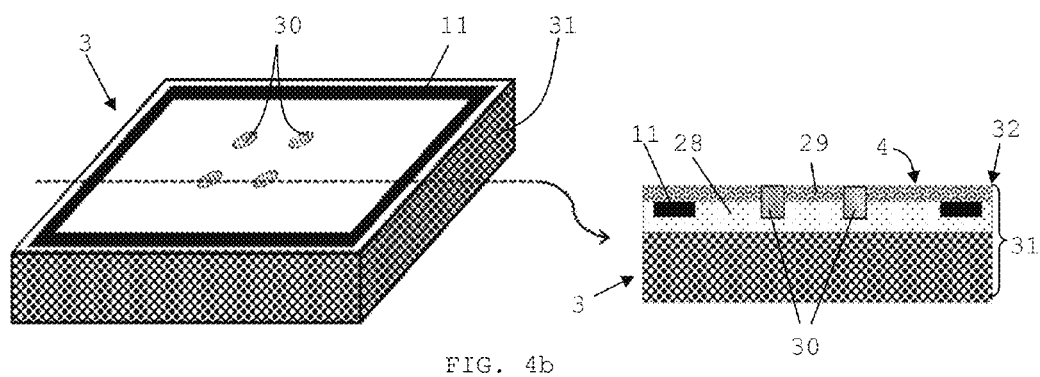

The chip 3 that is to be bonded to the substrate of FIG. 4a is shown in FIG. 4b. It is provided with a single non-charged conductor line 11 forming a closed loop, embedded also in a first passivation layer 28, and covered by a second passivation layer 29 that is also a wetting layer or covered by a wetting layer or it has been subjected to a wetting treatment. Microbumps 30 are again at the same level with the upper surface of the second passivation layer 29. The chip is equally provided with a vertical sidewall 31 with a sharp edge 32 between the sidewall 31 and the contact area surface. The contact area 4 of the chip corresponds with the total area bordered by the vertical wall 31. In other words, the conductor lines are running along the circumference of the contact area 4 but are located underneath the contact area, and included in the footprint of the contact area, instead of being located outside the footprint and thus surrounding the contact area as in the case of FIGS. 1 to 3. Maintaining water on the contact area 4 is again achieved through the edge pinning effect. The passivation layers 26 and 28 may fully or partially correspond to the last metallization level in the Back End Of Line portion of the chip or of the substrate (if the substrate is an interposer chip for example, or a chip that is part of a chip stack, see further). The alignment conductors 6/7/11 may thus be produced on a chip or substrate as part of the production process of the chip or substrate itself, instead of being applied afterwards (as is the case in the embodiment of FIGS. 1 to 3), on top of the substrate or chip. In the embodiment of FIG. 4, the conductor lines are thus incorporated in the components that are to be aligned, whereas in the embodiments of FIGS. 1 to 3, the conductor lines are applied on top of the components. It is to be noted that any of the embodiments of FIGS. 1 to 3 in terms of the type of conductors (e.g. conductors with interdigitated extensions 21 in FIG. 3), can be incorporated in the components, e.g. as metal lines in the last BEOL level of the components.

Figure 5A:
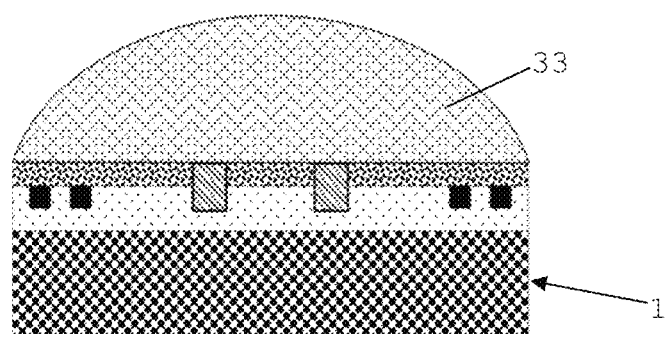
FIGS. 5a-5d show the alignment process for the components shown in FIG. 4.
Figure 5B:
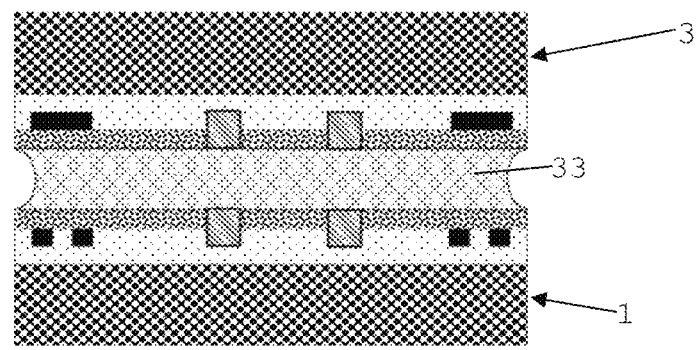
Figure 5C:
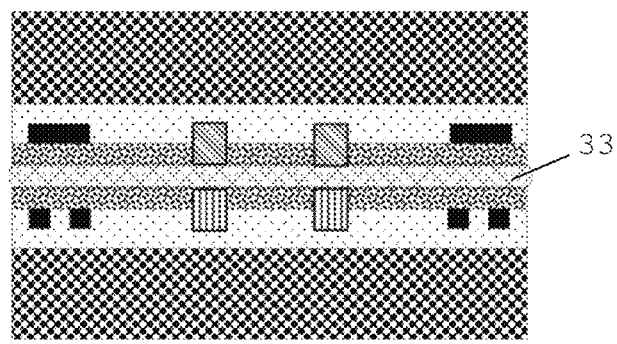
Figure 5D:
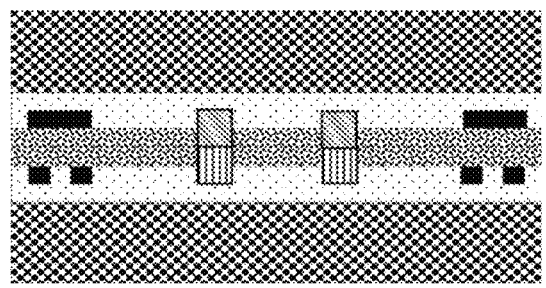

FIGS. 5a to 5d illustrate the alignment process for the substrate and the chip of FIG. 4. In FIG. 5a, a drop of water 33 is applied to the substrate's contact area 2. The drop provides wetting of the contact area through the effect of the wetting layer 27, and is contained on the surface through the edge pinning effect. Then the chip 3 is placed (pre-aligned and released), and the water droplet establishes self-alignment between the two contact areas 2 and 4 through the capillary force effect (FIG. 5b). As the water evaporates (FIG. 5c), possibly by heating the assembly, the electrostatic alignment helps to ensure that perfect alignment is obtained and maintained, the electrostatic alignment forces growing stronger as the gap between the substrate and chip decreases. When all the water is evaporated or otherwise removed, the electrostatic forces ensure that the alignment remains intact during the actual bonding process wherein an electrical connection is established between the microbumps (FIG. 5d), for example through bonding between the passivation layers 27 and 29. These can be oxide/metal interconnect layers that can form a bond with or without pressure/heat, known as the 'direct bonding' technique.

Figure 6A:
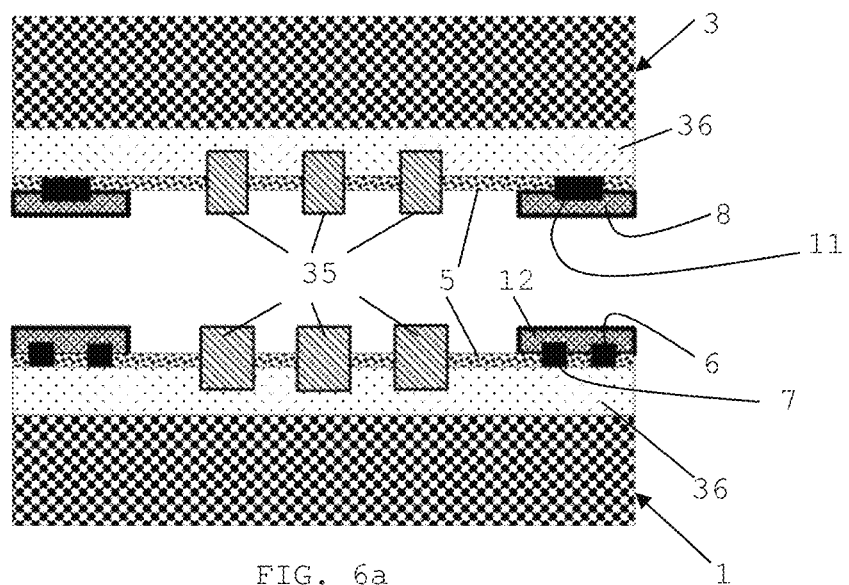
FIGS. 6a and 6b show a more detailed view of a set of components shown schematically in FIG. 1.
Figure 6B:
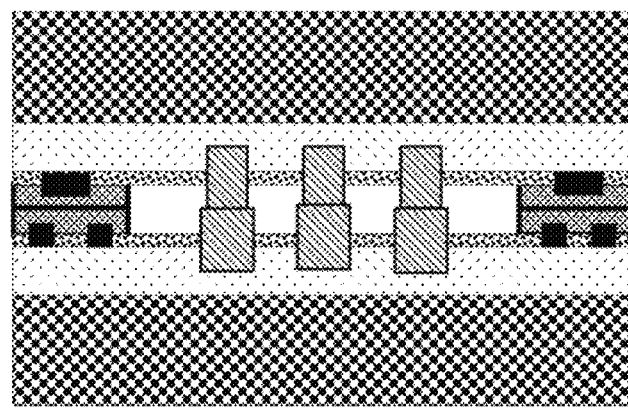

FIG. 6 shows a more detailed view of the embodiment already illustrated in FIG. 1. This time, microbumps 35 are shown on the substrate 1 and on the chip 3. It is seen that the conductors 6/7 and 11 are in fact embedded in the wetting layer 5 from which they are slightly protruding. The hydrophobic strips 8 and 12 are located on the upper surface of the wetting layers 5. The wetting layers 5 are deposited on passivation layers 36 which may fully or partly correspond to the top metallization level of the Back End Of Line portion of the chip or substrate (if the substrate is an interposer substrate for example).

Figure 7:
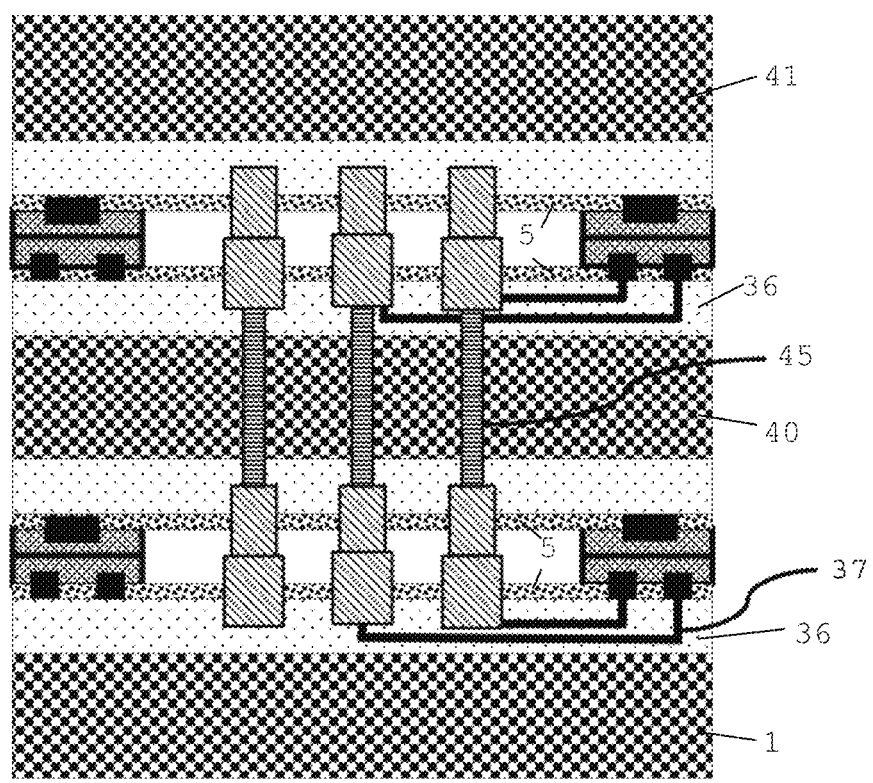
FIG. 7 shows a stack of multiple components aligned according to the method of the disclosure.

The method of the disclosure may be applied for producing a stack of several components, or multiple stacks, for example one or more stacks of chips on a carrier substrate. This is illustrated in FIG. 7. Each chip in the stack except the uppermost chip is provided with a hydrophilic contact surface 5 on both sides of the chip. Equally on both sides of the chip, conductor lines are provided to realize the electrostatic alignment as described above. In the example shown in FIG. 7, the middle chip 40 in a stack of two chips 40/41 on a substrate 1 is provided with a single conductor line around its lower contact surface, and a double conductor line around its upper contact surface. The alignment between the middle chip 40 and the upper chip 41 takes place according to the embodiment of FIG. 1, with the middle chip 40 playing the part of the substrate. The conductor lines on the upper surface of the middle chip 40 need to be supplemented with a charge from an exterior source. This can for example be done by providing so called 'through silicon vias' 45 that run within the middle chip 40. By way of metal lines 37 provided in the passivation layers 36, the conductors on the top surface of the chip can then be charged by the same source as the conductors on the substrate 1.

Figure 8:
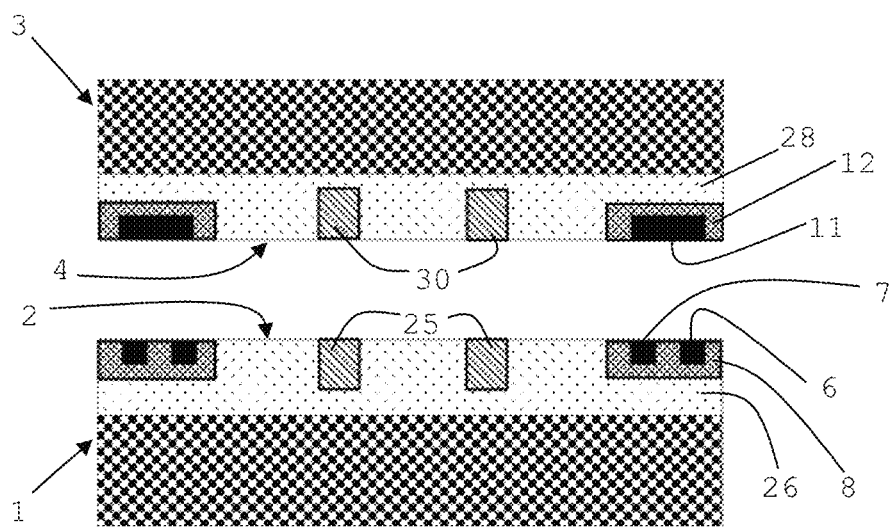
FIGS. 8 and 9 show alternative embodiments of the method and assembly according to the disclosure.
Figure 9:
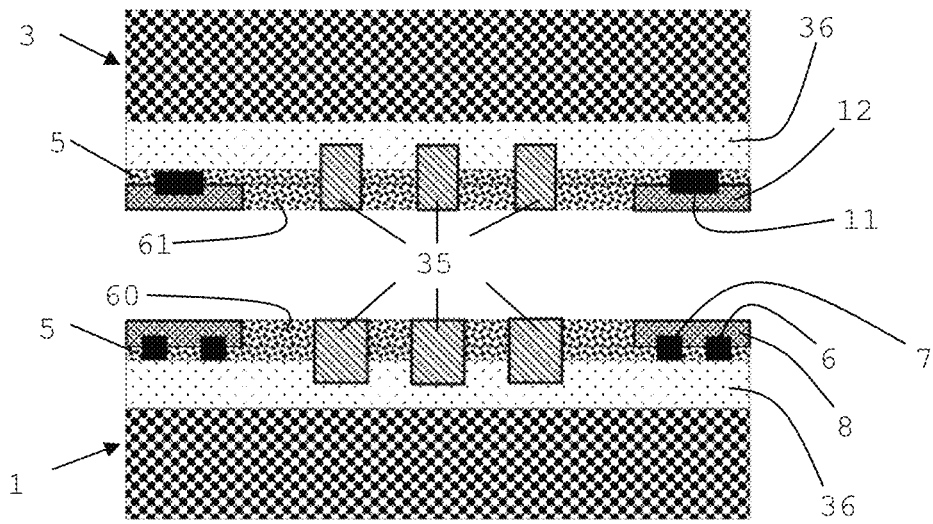

Two further embodiments are illustrated in FIGS. 8 and 9. FIG. 8 shows a variation of the embodiment of FIG. 4, wherein the conductor lines 6/7 and 11 are incorporated in the passivation layers 26 and 28 (e.g. the last BEOL level of an IC chip or interposer), and at the same time embedded in a strip of hydrophobic material 8/12 that is also incorporated in the passivation layer. The passivation layers 26/28 are themselves hydrophilic or made hydrophilic by application of a hydrophilic coating or treatment. The contact areas 2/4 are the areas surrounded by the hydrophobic strips 8/12 respectively. FIG. 9 is basically the embodiment of FIGS. 1 and 6 wherein the upper surface is levelled to the level of the bumps 35, by passivation layers 60/61, for example an oxide layer suitable for use in a direct bonding technique.

Figure 10A:
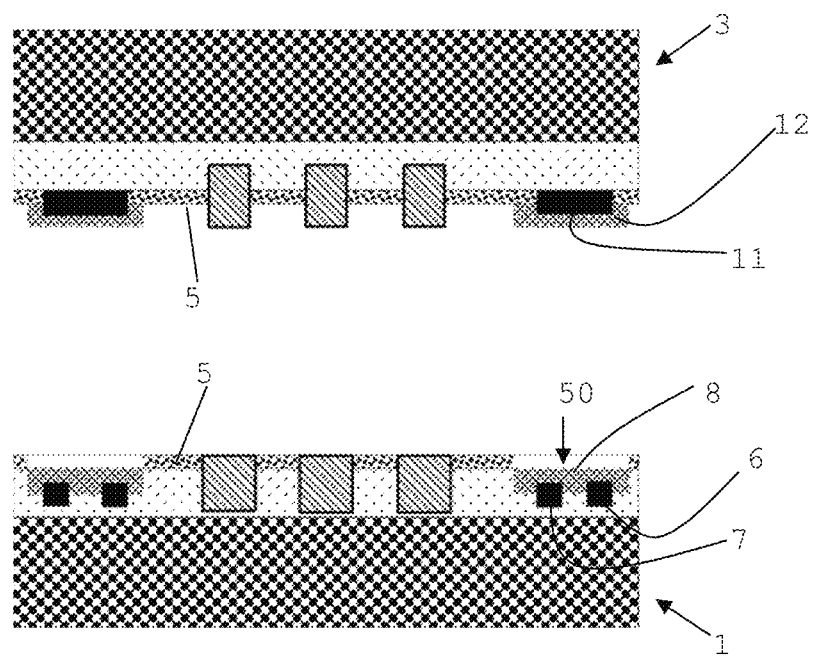
FIGS. 10a and 10b illustrate an embodiment wherein the alignment is further enhanced by a conformal lock-and-key mechanism.
Figure 10B:
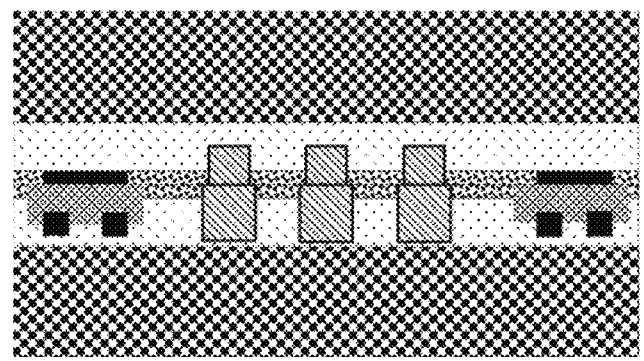

According to an embodiment, a further alignment means is added to the electrostatic and the capillary force-induced alignment means described above. This is referred to as a conformal lock and key-based alignment, obtained by suitable processing of the conductor lines on one of the components that are to be aligned. Different approaches to conformal lock and key can be adopted depending on the requirement of the (micro)components that are to be aligned. One such approach is illustrated in FIG. 10. The substrate 1 is again provided with a contact area 2 covered with a hydrophilic layer 5, and with a double conductor line 6/7 embedded in a hydrophobic strip 8. The chip's contact area 4 is also once again provided with a hydrophilic layer 5 and a single closed loop conductor line 11 for electrostatic alignment through opposite charging of the conductor lines 6/7 and 11. The substrate's conductor lines 6/7 are now however provided in a recess 50 that runs along the circumference of the substrate's contact area 2. The transversal cross-section of the recess 50 corresponds to the shape of the hydrophobic strip 12 on the chip, so that the recess and the strip may fit together in a lock and key fashion so as to establish alignment between the chip and the substrate. The conformal lock and key feature may be combined with any of the electrostatic alignment embodiments described above, and with any other embodiments that fall within the scope of the present disclosure. The recess 50 may be on the chip instead of on the substrate.

Other lock and key alignment means may be present instead of or in addition to the mechanism of FIG. 10 (where a hydrophobic strip forms the 'key' that fits into a corresponding recess in the other component). The microbumps 35 may be produced as a bump on one component and a corresponding hollow bonding pad on the other, as known in the art by the term 'insertion bonding'. Other features on the surface might be used as 'keys' to fit into corresponding recesses on the opposite surface, e.g. spherical key/recess, hexagonal key/recess, pyramidal key/recess.

Other embodiments or variations on the general principle of the disclosure are within the scope of the appended claims, for example: the circumference of the contact areas may differ from a rectangular shape. According to an embodiment, the strip of anti-wetting material may be placed outside the conductor lines, when the conductor lines are incorporated in a passivation layer that is part of the component to be aligned. In the case of FIG. 4 for example, this would mean that the vertical side wall 24 is replaced by an area of hydrophobic material surrounding the contact areas 2 and 4. Several combinations of embodiments described above will be understood by the skilled person to be within the scope of the appended claims. For example, the embodiments of FIGS. 4, 6, 8, 9 and 10 can easily be brought into practice with the conductor lines of FIG. 2, i.e. one conductor line 15/16 on each of the components to be aligned. The components to be aligned may be provided with different means for containing the alignment liquid, e.g. a strip of hydrophobic material on the substrate, and a vertical side wall on the chip.

In the above-described embodiments where one of the components to be aligned is provided with a non-charged conductor line 11, this conductor line has been described as a closed loop. However, this is not a requirement. For example a series of conductor lines running along the circumference of the contact area could be used, each conductor line being separately chargeable through the proximity of the positively and negatively charged conductors 6/7 in the opposing component.

The 'strip of anti-wetting material' referred to in the above description and the claims are preferably forming a closed loop around the contact area. However, according to specific embodiments, the strip may be interrupted by areas which are not anti-wetting, provided that the size of these areas is small enough not to cause a leak of alignment liquid from the contact areas. The width of a strip is related to the size of the active area and the amount of alignment liquid to be contained, and can be determined by the skilled person. Equally, the allowable size of openings in the strips is depending on the type of liquid used.

The alignment conductor lines 6/7/11/15/16 shown in the above-described embodiments or applied in any embodiment according to the disclosure need not necessarily be embedded in a strip of anti-wetting material or in a passivation layer of the component to be aligned. According to embodiments of the disclosure, the conductor lines of at least one of the components to be aligned is not embedded in any material, e.g. on top of a strip of anti-wetting material or on top of a passivation layer, such as the last metallization level of the BEOL portion of a component. Care must be taken in that case that the conductors are not in physical contact during the alignment procedure, for example by appropriately sizing the copper contact bumps.

The voltage applied for charging the conductor lines via an electrical potential supplied through an external source may vary depending on the size of the contact areas and other parameters related to the components. It may be DC or an AC voltage. For example a DC voltage between 10 and 1000V may be applicable depending on specific parameters.

The contact areas 2 and 4 are preferably as large as possible with respect to the component to be aligned. For example, the contact area 4 of the chip preferably corresponds to the surface area of the chip, as in the case of FIG. 4 or to the surface of the chip minus the surface of a hydrophobic strip 8/12/17/18. As stated above, conductor lines for electrostatic alignment may be underneath the contact area or adjacent to the contact area.

In any embodiment according to the disclosure, the 'means for containing the alignment liquid on the contact areas' can be brought into practice by any means for creating a wettability contrast between a first and second area. For example, the conductor lines themselves could be given anti-wetting properties by applying a self-assembled monolayer (SAM) to the conductors. Another way of obtaining a wettability contrast is Silicon recess etching.

In any embodiment where a single conductor line is shown (11 in FIG. 1/3/4 or 15/16 in FIG. 2), these can be replaced by multiple lines. In the embodiment of FIG. 1, the parallel lines 6/7 could be replaced by parallel groups of positively and negatively charged lines.

By way of example, a possible method for producing a conductor line on a component is described hereafter. On a glass carrier substrate, a layer of molybdenum is deposited by Physical Vapour Deposition. The layer is patterned by standard litho/plasma etching to form the conductor line. On top of the conductor line and the whole of the substrate, subsequent depositions are performed of SiO2 and SiN at high temperature, by Plasma Enhanced Physical Vapour Deposition, after which these layers are again patterned to form a stack of SiO2 and SiN at least on top of the conductor line. The stack of SiO2 and SiN, possibly after being provided with an anti-wetting coating or treatment, form an anti-wetting strip 8/12 as shown in FIGS. 1 and 6.

While the disclosure has been illustrated and described in detail in the drawings and foregoing description, such illustration and description are to be considered illustrative or by way of example and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Unless specifically specified, the description of a layer being present, deposited or produced 'on' another layer or substrate, includes the options of the layer being present, produced or deposited directly on, i.e. in physical contact with, the other layer or substrate, and the layer being present, produced or deposited on one or a stack of intermediate layers between the layer and the other layer or substrate.

The invention claimed is:

1. A method for aligning a first micro-electronic component to a second micro-electronic component, wherein each component includes a contact area covered by a wetting layer, wherein each component includes a means for containing an alignment liquid on the respective wetting layer, and wherein each component is further provided with one or more conductor lines running along a circumference of the respective contact area, the method comprising:
   applying an amount of the alignment liquid to the contact area of the second component;
   placing the first component with its contact area facing the contact area of the second component so that the alignment liquid contacts both wetting layers, thereby establishing self-alignment of the contact areas through capillary force;
   applying an electric potential such as to charge the conductor lines of at least one of the components in a manner to realize an electrostatic alignment of the contact areas; and
   maintaining the electrostatic alignment while the alignment liquid evaporates.

2. The method according to claim 1, wherein on at least one of the components, the means for containing a liquid on the wetting layers comprise at least one strip of anti-wetting material running along the circumference of the contact area.

3. The method according to claim 2, wherein the conductor lines are embedded in or located on top of the strip of anti-wetting material.

4. The method according to claim 1, wherein on at least one of the components, the means for maintaining a liquid on the wetting layers comprise a vertical sidewall surrounding the contact areas.

5. The method according to claim 1, wherein on at least one of the components, the means for maintaining a liquid on the wetting layers comprises the conductor lines themselves, and wherein the conductor lines have been provided with anti-wetting properties.

6. The method according to claim 1, wherein one of the components comprises a pair of conductor lines while the other component comprises a single conductor line, and wherein opposite electric potentials are applied to charge the pair of conductor lines, while no potential is applied to the single conductor line.

7. The method according to claim 6, wherein the pair of conductor lines comprises interdigitated lateral extensions.

8. The method according to claim 1, wherein each of the first and second components comprises at least one conductor line, and wherein first and second potentials are applied to charge the conductor line(s) of the first and second components, the first and second potentials being mutually opposite.

9. The method according to claim 1, wherein the conductor lines on at least one of the components are present on top of the component.

10. The method according to claim 1, wherein the conductor lines on at least one of the components are incorporated in a passivation layer that is a part of the component.

11. The method according to claim 1, wherein the conductor lines of one of the components are located in a recess running around the circumference of the contact area of the component, and wherein the conductor lines of the other component are extending outwardly from the surface of the component, so that the alignment is further enhanced through a conformal lock and key mechanism.

12. The method for bonding a first micro-electronic component to a second micro-electronic component, wherein the first and second components are aligned according to the method of claim 1, followed by the step of establishing a permanent bond between the components.

13. The method of claim 1, wherein the first micro-electronic component includes a first bonding structure in the respective contact area, and the second micro-electronic component includes a second bonding structure in the respective contact area, further comprising bonding the first and second bond structures together.

14. The method of claim 13, wherein at least one of first bonding structure or the second bonding structure includes a solder ball or microbump.

15. The method of claim 6, wherein the single conductor line runs in a closed loop along the circumference of the respective contact area.

* * * * *